United States Patent
Hsuan et al.

[11] Patent Number: 6,166,444
[45] Date of Patent: Dec. 26, 2000

[54] CASCADE-TYPE CHIP MODULE

[75] Inventors: Min-Chih Hsuan, Hsinchu; Charlie Han, Hsinchu Hsien, both of Taiwan

[73] Assignee: United Microelectronics Corp., Hsinchu, Taiwan

[21] Appl. No.: 09/337,708

[22] Filed: Jun. 21, 1999

[51] Int. Cl.[7] .......................... H01L 23/485; H01L 23/52; H01L 23/522; H01L 29/40
[52] U.S. Cl. ........................... 257/777; 257/723; 257/786
[58] Field of Search ............................ 257/678, 723–726, 257/777, 786

[56] References Cited

U.S. PATENT DOCUMENTS

| | | | |
|---|---|---|---|
| 5,198,963 | 3/1993 | Guptan et al. | 361/386 |
| 5,399,898 | 3/1995 | Rostoker | 257/499 |
| 5,614,766 | 3/1997 | Takasu et al. | 257/777 |
| 5,677,567 | 10/1997 | Ma et al. | 257/666 |
| 5,872,700 | 2/1999 | Collander | 361/760 |
| 6,057,598 | 5/2000 | Payne et al. | 257/723 |
| 6,091,138 | 7/2000 | Yu et al. | 257/686 |

*Primary Examiner*—David Mis
*Attorney, Agent, or Firm*—Hickman, Coleman & Hughes, LLP

[57] ABSTRACT

A cascade-type chip module. A laminate substrate having contacts is provided. Chips suitable for the cascade-type module are provided. Each chip includes a redistribution layer having a first region and a second region and bump contacts over the redistribution layer. A layout of the bump contacts coupling with the first region of the redistribution layer is an image rotationally symmetrical to the layout of those coupling with the second region of the redistribution layer, and each of the bump contacts coupling with the first region is coupled with a corresponding bump contact coupling with the second region through the redistribution layer. The chips are divided into a first group and a second group; the first group is stacked on the second group such that the first region of each chip of the first group is aligned with the second region of each chip of the second group and the second region of each chip of the first group is aligned with the first region of each chip of the second group. The chips are coupled to each other by bumps. The chips are attached to the laminate substrate and the first group and the second group are respectively coupled with the contacts by two film carriers.

17 Claims, 5 Drawing Sheets

CASCADE-TYPE CHIP MODULE

BACKGROUND OF THE INVENTION

1. Field of Invention

The present invention relates to a semiconductor package. More particularly, the present invention relates to a cascade-type chip module.

2. Description of Related Art

The trend for electrical products is to be light, short, small and thin. Not only chip manufacturing technology but also packaging technology is developing rapidly to keep pace with this trend. Since width of a chip is reducing quickly, chip integration is increasing and chip volume is decreasing. As a result, it is an important task to develop a new packaging technology, which is able to form a small volume package.

Memory modules, for example, are common semiconductor products. Memory modules are generally formed by the following steps. Chips are first packaged, and then the packages are attached to a printed circuit board. Area occupied by the packages is large, so the packaging density is low.

FIG. 1 is a schematic, top view of a conventional dynamic random access memory (DRAM) module, and FIG. 2 is a schematic, cross-sectional view of FIG. 1 along a line II—II.

Referring to FIGS. 1 and 2, a die 12 is attached to a leadframe (not shown) and sealed in a packaging material 16 to form a package 10. During the assembly process, the package 10 is attached to a printed circuit board 18 through leads 14 by surface mounting technology (SMT). The leads 14 couple with contacts 20 on the printed circuit board 18. By traces 22, the package 10 can couple with other packages 10 and gold fingers 24 on the printed circuit board 18.

Although technology such as chip on board (COB), flip chip (FC), tape automatic bonding (TAB) or stack up is used to increase the packaging density, the increment of the packaging density is limited by factors like the area occupied by the traces on the substrate, the volume of each chip or the pitch between the leads.

SUMMARY OF THE INVENTION

The invention provides a cascade-type chip module. In the invention, the packaging density is increased and the signal transmission path is reduced; thus, the performance of the module is improved due to the reduced signal transmission path. Furthermore, the traces on the substrate are replaced by the redistribution layer on each chip, so that the volume of the module can be reduced.

As embodied and broadly described herein, the invention provides a cascade-type chip module. A laminate substrate having contacts is provided. Chips suitable for the cascade-type module are provided. Each chip includes a redistribution layer having a first region and a second region and bump contacts over the redistribution layer. The layout of the bump contacts coupling with the first region of the redistribution layer is an image rotationally symmetrical to the layout of the layout of those coupling with the second region of the redistribution layer. Each of the bump contacts coupling with the first region is coupled with a corresponding bump contact coupling with the second region through the redistribution layer. The chips are divided into a first group and a second group; the first group is stacked on the second group such that the first region of each chip of the first group is aligned with the second region of each chip of the second group and the second region of each chip of the first group is aligned with the first region of each chip of the second group. The chips are coupled to each other by bumps. The chips are attached to the laminate substrate and the groups are respectively coupled with the contacts by two film carriers.

As embodied and broadly described herein, the invention provides a chip suitable for a cascade-type chip module. Bonding pads are located on a substrate, and a first insulating layer is disposed over the substrate to expose the bonding pads. A redistribution layer having a first region and a second region is formed on the first insulating layer and is coupled with the bonding pads. A second insulating layer is formed on the redistribution layer and exposes a portion of the redistribution layer. Bump contacts are formed on the second insulating layer and couple with the redistribution layer. The layout of the bump contacts coupling with the first region of the redistribution layer is an image rotationally symmetrical to the layout of the layout of the bump contacts coupling with the second region of the redistribution layer. Each of the bump contacts coupling with the first region is coupled with a corresponding bump contact coupling with the second region through the redistribution layer.

In the invention, a chip is directly attached to another chip without any carrier; thus, the packaging density of the module is increased. Since the chip is directly attached to another chip without any carrier, the signal transmitting path is reduced and performance of the module is improved. Additionally, the traces on the substrate are replaced by the redistribution layer on each chip, so that the volume of the module can be reduced. The redistribution layer also serves as a shared bus between the chips. Because the line width of the redistribution layer is narrower than that of the traces on the substrate, the performance of the module is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

In the drawings.

DESCRIPTION OF THE PREFERRED EMBODIMENTS

Figure 1:
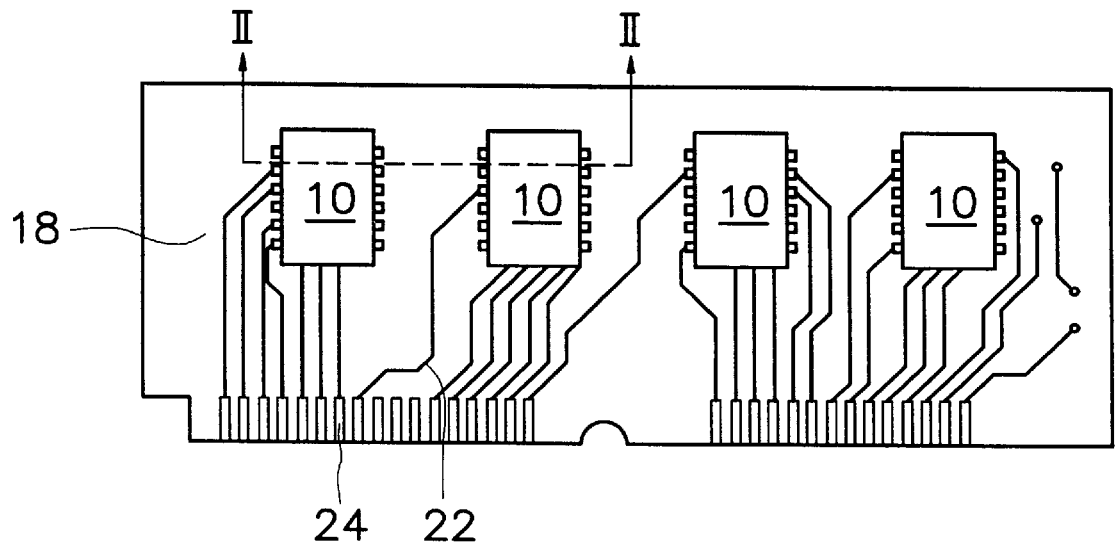
FIG. 1 is a schematic, top view of a conventional dynamic random access memory module.
Figure 2:
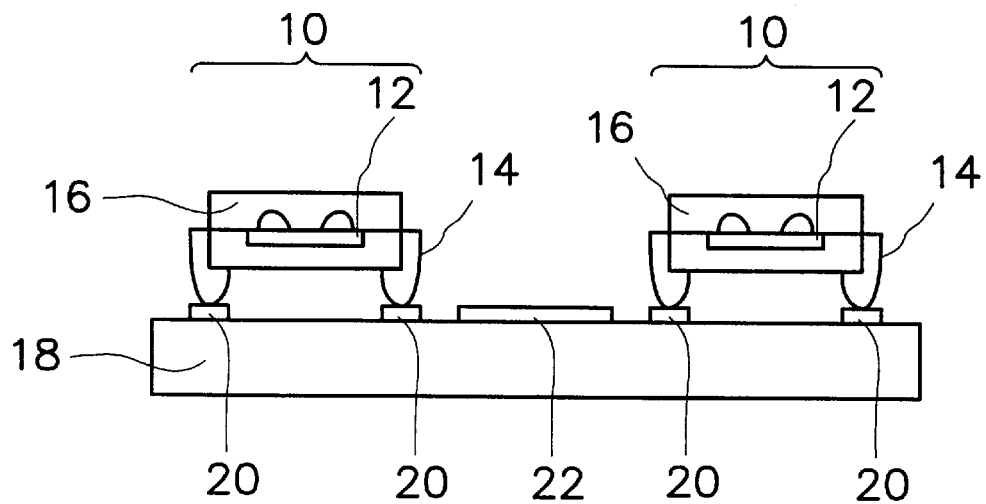
FIG. 2 is a schematic, cross-sectional view of FIG. 1 along a line II—II.
Figure 3:
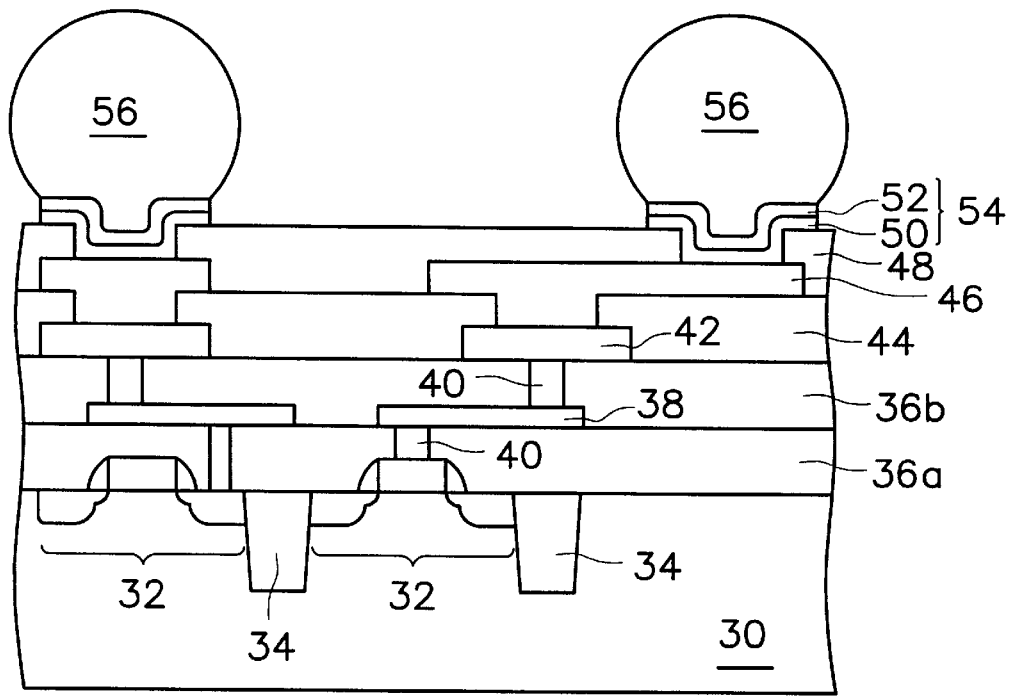
FIG. 3 is a schematic, cross-sectional diagram of a chip suitable for a cascade-type chip module according to the invention.
Figure 4:
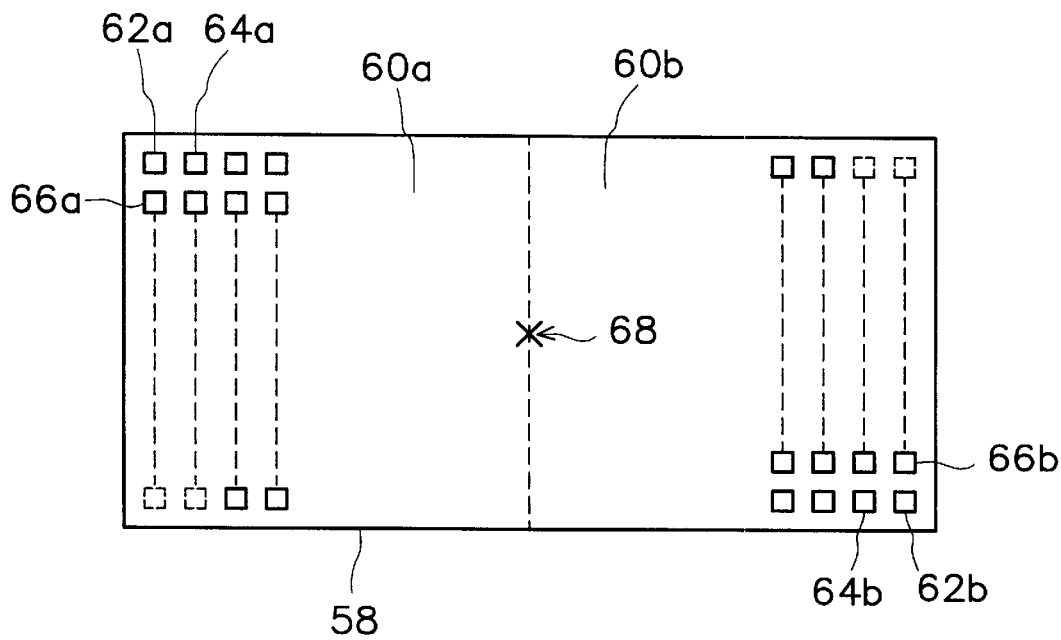
FIG. 4 is a schematic, top view of the chip shown in FIG. 3.

FIG. 3 is a schematic, cross-sectional diagram of a chip suitable for a cascade-type chip module according to the invention, and FIG. 4 is a schematic, top view of the chip shown in FIG. 3.

Referring to FIG. 3, the chip suitable for a cascade-type chip module is formed on a substrate 30 in which devices 32 and isolation structures 34 are formed. The devices 32 include metal oxide semiconductors (MOS), capacitors, inductors or resistors; the isolation structures 34 include field oxide layers or shallow trench isolation (STI) structures. An isolation layer 36a, a patterned metal layer 38 and an isolation layer 36b are formed on the substrate 30 in sequence. By the metal layer 38 and plugs 40 formed in the isolation layer 36a, 36b, the devices 32 couple with bonding pads 42 formed on the isolation layer 36b. The bonding pads 42 include aluminum. A passivation layer 44 is formed and exposes the bonding pads 42. The material used to form the passivation layer 44 is silicon dioxide, silicon nitride or a combination thereof.

A metal layer (not shown) is formed on the passivation layer 44 to couple with the bonding pads 42 and then is patterned to form a redistribution layer 46. An isolation layer 48 is formed on the passivation layer 46 and exposes a portion of the redistribution layer 46; the isolation layer 48 includes silicon nitride. Bump contacts 54 are formed on the isolation layer 48 and respectively couple with the redistribution layer 46 so that the bump contact is the so-called under ball metallurgy (UBM) layer. Each of the bump contacts 54 comprises a barrier layer 50 and a coated layer 52. The material used to form the barrier layer 50 is chromium, chromium-copper alloy, titanium, titanium-tungsten alloy or a combination thereof; the barrier layer 50 prevents particles in the subsequently formed bump from diffusing into the redistribution layer 46 and the bonding pad 42. The material used to form the coated layer 52 is selected from a group consisting of nickel, copper, gold, palladium, palladium-nickel alloy, silver and a combination thereof; the coated layer 52 improves adhesion between the redistribution layer 46 and the subsequently formed bump. Bumps 56 are formed on each of the bump contacts 54; the bumps 56 includes tin-lead alloy, gold or conductive polymer.

Referring to FIG. 4, to be suitable for the cascade-type chip module, the layout of the bump contacts on a chip 58 is divided into two groups such that each group has the same number of bump contacts, and the two groups are respectively located in regions 60a, 60b. Additionally, the layout of the group in the region 60a is an image rotationally symmetrical according to a point 68 to the layout of the other group in the region 60b. For example, in a dynamic random access memory chip, the address input AO in the region 60a is a bump contact 62a and the corresponding address input A0 in the region 60b is a bump contact 62b. Similarly, the address input A1, A2 in the region 60a are bump contacts 64a, 66a, and the corresponding address input A1, A2 in the region 60b are bump contacts 64b, 66b. Moreover, the bump contacts in the region 60a couple with the corresponding bump contacts in the region 60b through the redistribution layer. However, only some bump contacts couple with the bonding pads; bump contacts are coupled to each other through the redistribution layer, and do not couple with the bonding pads because these bump contacts serve as interconnection traces between the chips. In the layout mentioned above, each bonding pad couples with a bump contact in the region 60a and a bump contact in the region 60b, and the position of the bump contact in the region 60a is an image rotationally symmetrical according to a point 68 to the position of the bump contact in the region 60b.

Figure 5A:
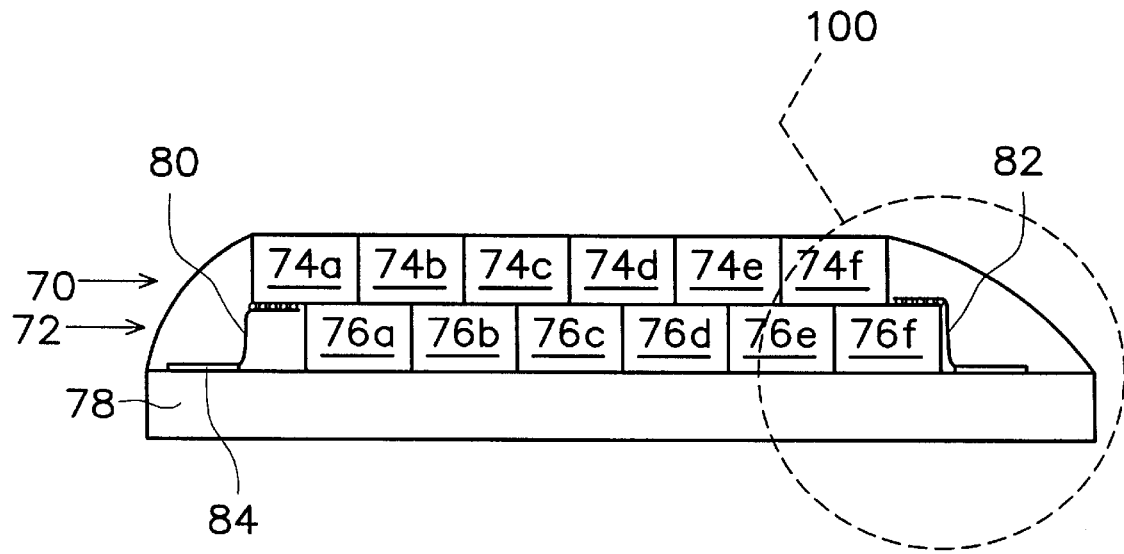
FIG. 5A is a schematic, cross-sectional view of a cascade-type chip module according to one preferred embodiment of this invention.
Figure 5B:
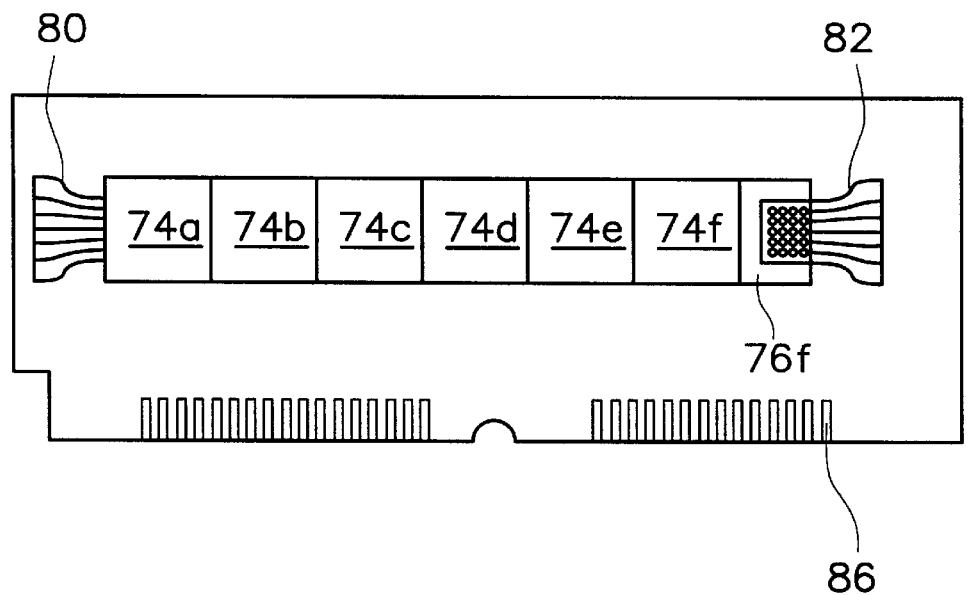
FIG. 5B is a schematic, top view of the cascade-type chip module shown in FIG. 5A.
Figure 5C:
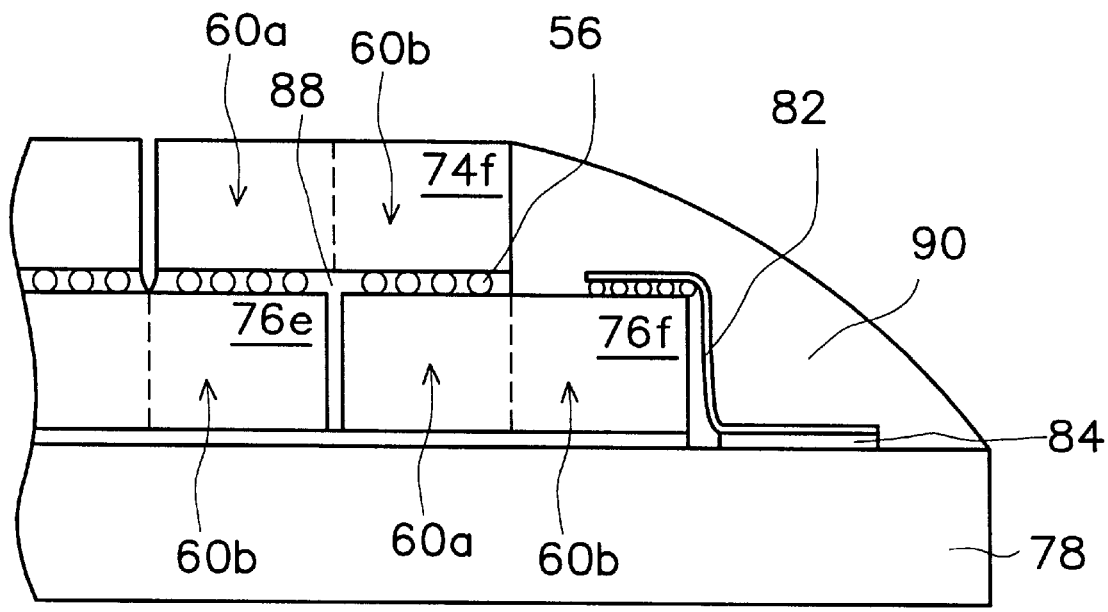
FIG. 5C is a schematic, enlarged view of a region 100 shown in FIG. 5A.

FIG. 5A is a schematic, cross-sectional view of a cascade-type chip module according to one preferred embodiment of this invention; FIG. 5B is a schematic, top view of the cascade-type chip module shown in FIG. 5A; FIG. 5C is a schematic, enlargement view of a region 100 shown in FIG. 5A.

Referring to FIGS. 5A, 5B and 5C, chips are divided into two groups 70, 72 such that the group 70 includes chips 74a–74f and the group 72 includes chips 76a–76f. The group 70 is stacked on the group 72. The region 60a (FIG. 4) of each of the chips 74b–74f is aligned with the region 60b (FIG. 4) of each of the chips 76a–76e, and the region 60b (FIG. 4) of each of the chips 74a–74f is aligned with the region 60a (FIG. 4) of each of the chips 76a–76f. Furthermore, the chips 74a–74f are coupled with the chips 76a–76f by the bumps 56 (FIG. 3). After the chips 74a–74f are stacked on the chips 76a–76f, the chips 76a–76f are attached to a laminate substrate 78 such as a printed circuit board. Contacts 84 formed on the laminate substrate 78 are between the ends of the groups 72. The chip 74a couples with the contacts 84 through a film carrier 80; similarly, the chip 76f couples with the contacts 84 through a film carrier 82. The contacts 84 connect to gold fingers 86 through traces (not shown) on the laminate substrate 78.

To protect the bumps 56 and the film carriers 80, 82, the space between the chips 74a–74f and the chips 76a–76f is filled with an underfill material 88, and the film carriers 80, 82 are sealed in a packaging material 90. Also, an anisotropic conductive paste (ACP) or an anisotropic film (ACF) is suitable for filling the space between the chips 74a–74f and the chips 76a–76f.

Figure 6:
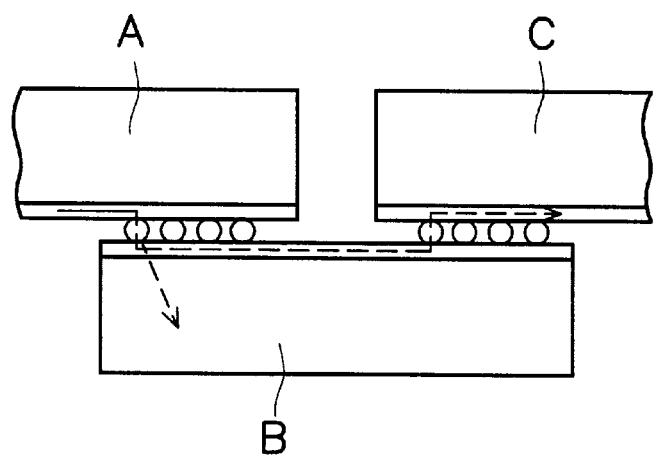
FIG. 6 is a diagram of a signal transmission scheme according to the invention.
Figure 7:
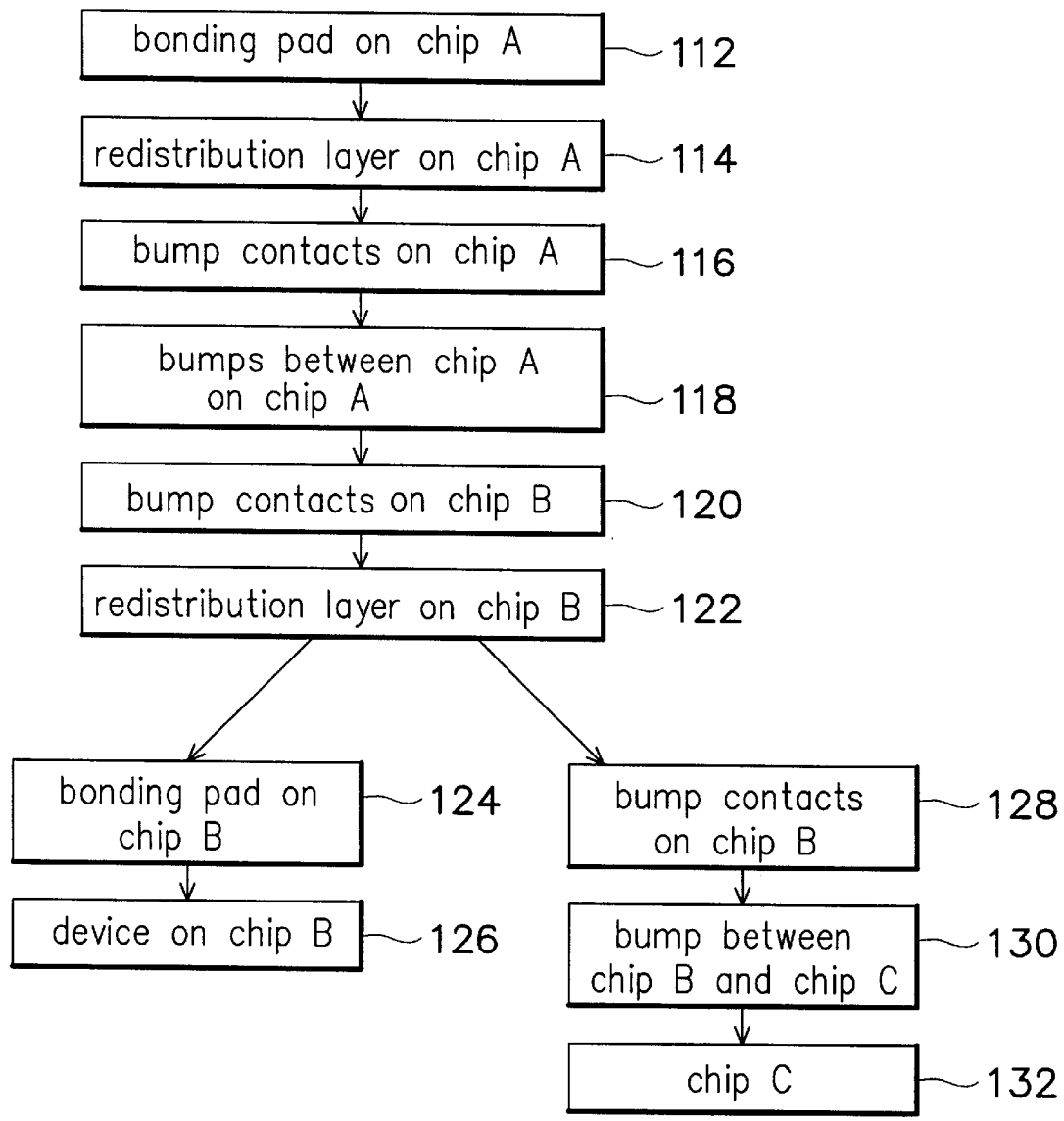
FIG. 7 is a flow chart illustrating the signal transmission scheme shown in FIG. 6.

FIG. 6 is a diagram of a signal transmission scheme according to the invention, and FIG. 7 is a flow chart illustrating the signal transmission scheme shown in FIG. 6.

Referring to FIGS. 6 and 7, in a dynamic random access memory module, signals of some pins such as address input, column address strobe (CAS), row address strobe (RAS), clock enable (CKE), Vcc or Vss can be transmitted by using a shared bus, and some pins should be directly coupled with a particular chip to transmit signals. The scheme of transmitting a signal by using a shared bus is described below. When a signal is transmitted from chip A to chip C, the signal is transmitted to a bonding pad on chip A (step 112) and then transmitted to a redistribution layer on chip A (step 114). Next, the signal is transmitted from the redistribution layer on chip A to a bump between chip A and chip B (step 118) through a bump contact on chip A (step 116). Then, the signal is transmitted to a redistribution layer on chip B (step 122) through a bump contact on chip B (step 120). The signal is transmitted to a bump between chip B and chip C (step 130) by a bump contact on chip B (step 128); then, the signal is transmitted to chip C (step 132).

In the scheme mentioned above, the redistribution layers serve as the shared bus between the chips for transmitting the signal. According to the use of the redistribution layer, the redistribution layer can replace traces on the substrate to serve as interconnection traces between the chips. As a result, the volume of the module can be reduced.

In the scheme of directly transmitting a signal to a particular chip, the signal is transmitted to a bonding pad on chip A (step 112) and then transmitted to a redistribution layer on chip A (step 114). Next, the signal is transmitted from the redistribution layer on chip A to a bump between chip A and chip B (step 118) through a bump contact on chip A (step 116). Then, the signal is transmitted to a redistribution layer on chip B (step 122) through a bump contact of chip B (step 120). The signal is transmitted to a device on chip B (step 126) through a bonding pad on chip B (step 124).

According to the foregoing, the advantages of the invention include the following:

1. In the invention, a chip is directly attached to another chip without any carrier; thus, the packaging density of the module is increased. Additionally, the volume of the module is reduced.

2. Since the chip is directly attached to another chip without any carrier, the signal transmitting path is reduced, and performance of the module is improved.

3. In the invention, the traces on the substrate are replaced by the redistribution layer on each chip, so that the volume of the module can be reduced. The redistribution layer also serves as a shared bus between the chips. Because the line width of the redistribution layer is narrower that of the traces on the substrate, the performance of the module is improved.

4. The layout of bump contacts on the chip suitable for the cascade-type chip module is divided into two groups, and the layout of one group is an image rotationally symmetrial to the layout of the other.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cascade-type chip module, comprising:
    a laminate substrate having a plurality of contacts;
    a plurality of chips on the laminate substrate such that each of the chips comprises:
        a plurality of bonding pads;
        a first insulating layer over the substrate and exposing the bonding pads;
        a redistribution layer having a first region and a second region on the first insulating layer, wherein the redistribution layer is coupled with the bonding pads; and
        a plurality of bump contacts over the redistribution layer coupling with the redistribution layer, in which a layout of the bump contacts coupling with the first region of the redistribution layer is an image rotationally symmetrial to the layout of the bump contacts coupling with the second region of the redistribution layer, and each of the bump contacts at the first region is coupled with a corresponding bump contact at the second region through the redistribution layer;
    wherein the chips are divided into a first group and a second group, the first group is stacked on the second group such that the first region of each chip of the first group is aligned with the second region of each chip of the second group and the second region of each chip of the first group is aligned with the first region of each chip of the second group, and chips are coupled to each other by bumps; and
    two film carriers respectively coupling the first group of chips and the second group of chips with the contacts.

2. The structure of claim 1, wherein the redistribution layer is made from traces, and only some traces are coupled with the bonding pads.

3. The structure of claim 1, wherein a second insulating layer is disposed between the bump contacts and the redistribution layer.

4. The structure of claim 1, wherein a space between the two groups of chips is filled with an underfill material.

5. The structure of claim 1, wherein the film carriers are sealed in a packaging material.

6. The structure of claim 5, wherein a region of the film carriers couples with the chips and a region of the film carriers couples with the contacts are sealed in the packaging material.

7. The structure of claim 1, wherein each of the bump contacts comprises a barrier layer and a coated layer.

8. The structure of claim 7, wherein the material used to form the barrier layer is selected from a group consisting of chromium, chromium-copper alloy, titanium, titanium-tungsten alloy and a combination thereof.

9. The structure of claim 7, wherein the material used to form the coated layer is selected from a group consisting of nickel, copper, gold, palladium, palladium-nickel alloy, silver and a combination thereof.

10. The structure of claim 1, wherein the material used to form the conducting bumps is selected from a group consisting of tin-lead alloy, gold, conductive polymer and a combination thereof.

11. A chip suitable for a cascade-type chip module, comprising:
    a substrate having a plurality of devices;
    a plurality of bonding pads over the substrate coupling with the devices;
    a first insulating layer over the substrate exposing the bonding pads;
    a redistribution layer having a first region and a second region on the first insulating layer, wherein the redistribution layer is coupled with the bonding pads;
    a second insulating layer on the redistribution layer exposing a portion of the redistribution layer; and
    a plurality of bump contacts on the second insulating layer coupling with the redistribution layer, such that a layout of the bump contacts coupling with the first region of the redistribution layer is an image rotationally symmetrial to the layout of the bump contacts coupling with the second region of the redistribution layer, and each of the bump contacts coupling with the first region is coupled with a corresponding bump contact coupling with the second region through the redistribution layer.

12. The structure of claim 11, wherein the redistribution layer is made from traces, and only some traces are coupled with the bonding pads.

13. The structure of claim 11, wherein each of the bump contacts comprises a barrier layer and a coated layer.

14. The structure of claim 13, wherein the material used to form the barrier layer is selected from a group consisting of chromium, chromium-copper alloy, titanium, titanium-tungsten alloy and a combination thereof.

15. The structure of claim 13, wherein the material used to form the coated layer is selected from a group consisting of nickel, copper, gold, palladium, palladium-nickel alloy, silver and a combination thereof.

16. The structure of claim 11, wherein bumps are respectively disposed on the bump contacts.

17. The structure of claim 16, wherein the material used to form the conducting bumps is selected from a group consisting of tin-lead alloy, gold, conductive polymer and a combination thereof.

* * * * *